(12) United States Patent
Shim et al.

(10) Patent No.: US 9,110,318 B2
(45) Date of Patent: Aug. 18, 2015

(54) DRIVING DEVICE OF DISPLAY APPARATUS AND METHOD OF MANUFACTURING THE DRIVING DEVICE

(71) Applicant: SAMSUNG ELECTRONICS CO., LTD., Suwon-si (KR)

(72) Inventors: Dong-sik Shim, Hwaseong-si (KR); Woon-bae Kim, Seoul (KR); Hyung Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/079,138

(22) Filed: Nov. 13, 2013

(65) Prior Publication Data

US 2014/0131744 A1 May 15, 2014

(30) Foreign Application Priority Data

Nov. 13, 2012 (KR) .................. 10-2012-0128265

(51) Int. Cl.
| | | |
|---|---|---|
| *H01L 33/08* | (2010.01) | |
| *G02F 1/13* | (2006.01) | |
| *G02B 26/02* | (2006.01) | |
| *H01L 27/12* | (2006.01) | |
| *G02F 1/1362* | (2006.01) | |
| *G02F 1/1368* | (2006.01) | |
| *H01L 21/77* | (2006.01) | |

(52) U.S. Cl.
CPC *G02F 1/13* (2013.01); *G02B 26/02* (2013.01); *G02F 1/1368* (2013.01); *G02F 1/136213* (2013.01); *H01L 27/1214* (2013.01); *H01L 27/1259* (2013.01); *H01L 2021/775* (2013.01)

(58) Field of Classification Search
CPC ... H01L 33/40; H01L 33/52; H01L 2021/775; F21K 9/56; F21V 9/16; G02F 1/13; G02B 26/02
USPC ........... 257/88, 40, 28; 438/22, 23, 26, 28, 34
See application file for complete search history.

(56) References Cited

U.S. PATENT DOCUMENTS

| | | | |
|---|---|---|---|
| 4,954,789 A * | 9/1990 | Sampsell ................ 359/318 |
| 6,191,835 B1 * | 2/2001 | Choi ...................... 349/106 |
| 6,411,423 B2 | 6/2002 | Ham | |
| 6,599,787 B2 | 7/2003 | Trainor et al. | |
| 7,391,055 B1 | 6/2008 | Murakami et al. | |
| 8,049,255 B2 | 11/2011 | Sakai et al. | |
| 8,604,477 B2 * | 12/2013 | Lin et al. ................ 257/59 |
| 2003/0058377 A1 * | 3/2003 | Chae et al. ............. 349/43 |
| 2012/0138932 A1 * | 6/2012 | Lin et al. ............... 257/59 |
| 2013/0329271 A1 | 12/2013 | Shim | |

FOREIGN PATENT DOCUMENTS

| | | |
|---|---|---|
| KR | 10-2006-0114757 A | 11/2006 |
| KR | 10-2006-0135429 A | 12/2006 |
| KR | 10-0669457 B1 | 1/2007 |
| KR | 10-0675638 B1 | 2/2007 |
| KR | 10-2009-0058989 A | 6/2009 |
| KR | 10-2010-0034545 A | 4/2010 |

* cited by examiner

*Primary Examiner* — Nikolay Yushin
(74) *Attorney, Agent, or Firm* — Sughrue Mion, PLLC

(57) ABSTRACT

A driving device of a display apparatus, and a method of manufacturing the driving device. The driving device may have a specific structure, and be manufactured in such a manner, because a first electrode of a micro optical switch device may be formed simultaneously with the formation of at least a source region and a drain region, or a gate electrode of an active device and a capacitor electrode.

14 Claims, 5 Drawing Sheets

DRIVING DEVICE OF DISPLAY APPARATUS AND METHOD OF MANUFACTURING THE DRIVING DEVICE

CROSS-REFERENCE TO RELATED APPLICATION

This application claims the priority from Korean Patent Application No. 10-2012-0128265, filed in the Korean Intellectual Property Office on Nov. 13, 2012, the disclosure of which is incorporated herein by reference in its entirety.

BACKGROUND

1. Field

Apparatuses and methods consistent with the present disclosure relate to a driving device of a display apparatus and a method of manufacturing the driving device, and more particularly, to an active device used to drive a display apparatus and a method of manufacturing a micro optical switch device.

2. Description of the Related Art

A variety of display apparatuses have been developed such as cathode ray tube (CRT) type display apparatuses and flat panel display apparatuses, such as liquid crystal displays (LCDs) and plasma display panels (PDPs).

In CRT type display apparatuses, an image is displayed when an electron beam collides with a fluorescent material. The CRT type display apparatuses are, however, difficult to manufacture, transport, and use because of the large cubic dimensions of the CRT displays, particularly the greater widths of the CRT displays. Alternatively, a variety of flat panel display apparatuses have been developed which generally have substantially smaller width values as compared to CRT displays.

SUMMARY

One or more exemplary embodiments provide a driving device of a display apparatus and a method of manufacturing the driving device.

According to an aspect of an exemplary embodiment, there is provided a driving device of a display apparatus, the driving device including an active device formed in a first region of a substrate, a micro optical switch device formed in a second region of the substrate, and a capacitor formed on the substrate between the active device and the micro optical switch device. The active device may include a gate electrode formed in the first region of the substrate, an insulating layer formed on the gate electrode, an active region formed on the insulating layer above the gate electrode, and a source region and a drain region respectively formed at either side of the active region. The micro optical switch device may include a first electrode formed on the insulating layer in the second region of the substrate, and a second electrode formed above and spaced apart from the first electrode.

The capacitor may include a capacitor electrode formed between the active device and the micro optical switch device.

The driving device may further include a passivation layer formed on the source region, the drain region, and the first electrode.

The source region, the drain region, and the first electrode may be formed of the same material.

According to another aspect of an exemplary embodiment, there is provided a driving device of a display apparatus, the driving device including an active device formed in a first region of a substrate, a micro optical switch device formed in a second region of the substrate, and a capacitor formed on the substrate between the active device and the micro optical switch device, wherein the active device includes a gate electrode formed in the first region of the substrate, an insulating layer formed on the gate electrode, an active region formed on the insulating layer above the gate electrode, and a source region and a drain region respectively formed at either side of the active region, and wherein the micro optical switch device includes a first electrode formed in the second region on the substrate, and a second electrode formed above and spaced apart from the first electrode.

The capacitor may include a capacitor electrode formed between the active device and the micro optical switch device.

The driving device may further include a passivation layer formed on the source region, the drain region, and the first electrode.

The gate electrode, the capacitor electrode, and the first electrode may be formed of the same material.

According to another aspect of an exemplary embodiment, there is provided a method of manufacturing a driving device of a display apparatus, the method including forming a gate electrode of an active device and a capacitor electrode on a substrate, forming an active region on an insulating layer above the gate electrode, and forming a source region and a drain region of the active device, and a first electrode of a micro optical switch device by forming a conductive material layer on the insulating layer and the active region and patterning the conductive material layer.

The forming the gate electrode may further include forming a conductive material layer on the substrate and patterning the conductive material layer, and forming the insulating layer.

The method may further include forming a passivation layer on the source region, the drain region, and the first electrode using insulating material.

The method may further include forming a sacrificial layer on the passivation layer, forming a second electrode on the sacrificial layer above the first electrode using conductive material, and removing the sacrificial layer.

According to another aspect of an exemplary embodiment, there is provided a method of manufacturing a driving device of a display apparatus, the method including forming a gate electrode of an active device, a capacitor electrode, and a first electrode of a micro optical switch device by forming a conductive material layer on a substrate and patterning the conductive material layer, and forming an insulating layer, forming an active region on the insulating layer above the gate electrode, and forming a source region and a drain region of the active device.

Forming the source region and the drain region may further include forming a conductive material layer on the insulating layer and the active region, and patterning the conductive material layer.

The method may further include forming a passivation layer on the source region, the drain region, and the first electrode using insulating material.

The method may further include forming a sacrificial layer on the passivation layer, forming a second electrode on the sacrificial layer above the first electrode, and removing the sacrificial layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
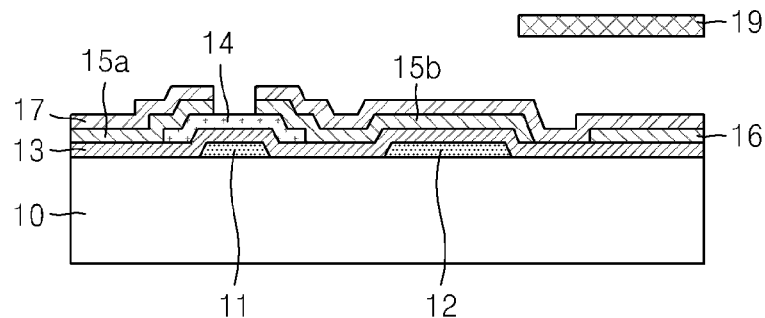
FIG. 1A is a cross-sectional view of a driving device of a display apparatus according to an exemplary embodiment.

Hereinafter, a driving device of a display apparatus and a method of manufacturing the driving device according to exemplary embodiments will be described in detail with reference to the accompanying drawings. In the drawings, the thickness of layers and regions may be exaggerated for clarity. The same reference numerals represent the same elements throughout the drawings. As used herein, the term "and/or" includes any and all combinations of one or more of the associated listed items. Expressions such as "at least one of," when preceding a list of elements, modify the entire list of elements and do not modify the individual elements of the list.

Figure 2:
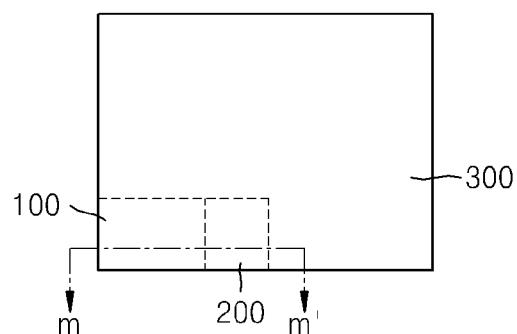
FIG. 2 is a schematic plan view of a driving device of a display apparatus according to an exemplary embodiment.

FIG. 1A is a cross-sectional view of a driving device of a display apparatus according to an exemplary embodiment. FIG. 2 is a schematic plan view of a driving device of a display apparatus according to an exemplary embodiment. FIG. 1A may be a cross-sectional view taken along a line m-m' of FIG. 2.

Referring to FIGS. 1A and 2, the driving device may include an active device 100, a capacitor 200, and a micro optical switch device 300 formed on a substrate 10.

A thin film transistor (TFT) structure may be formed as the active device 100 on a first region of the substrate 10. The TFT structure may include a gate electrode 11 formed on the first region of the substrate 10, an insulating layer 13 formed on the gate electrode 11, an active region 14 formed on a region of the insulating layer 13 corresponding to the gate electrode 11, and a source region 15a and a drain region 15b respectively formed at either side of the active region 14. A passivation layer 17 may be formed on each of the source region 15a and the drain region 15b. The micro optical switch device 300 may be formed on a second region of the substrate 10 in which the active device 100 is not formed. The micro optical switch device 300 may include the substrate 10, a first electrode 16 formed on the insulating layer 13, and a second electrode 19 formed above the first electrode 16 and the passivation layer 17 to be spaced apart from the first electrode 16. A capacitor electrode 12 may be formed on the substrate 10 between the active device 100 and the micro optical switch device 300.

In the driving device illustrated in FIG. 1A, all of the source region 15a and the drain region 15b of the active device 100 and the first electrode 16 of the micro optical switch device 300 are formed on the insulating layer 13. The source region 15a and the drain region 15b of the active device 100 and the first electrode 16 of the micro optical switch device 300 may be formed simultaneously by depositing a conductive material on the insulating layer 13.

Figure 1B:
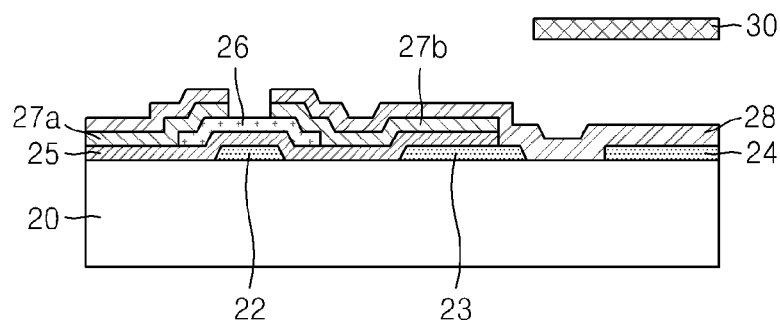
FIG. 1B is a cross-sectional view of a driving device of a display apparatus according to another exemplary embodiment.

FIG. 1B is a cross-sectional view of a driving device of a display apparatus according to another exemplary embodiment. FIG. 1B may also be a cross-sectional view taken along the line m-m' of FIG. 2.

Referring to FIGS. 1B and 2, the driving device may include an active device 100, a capacitor 200, and a micro optical switch device 300 formed on a substrate 20. The active device 100 may have a TFT structure and may be formed on a first region of the substrate 20. The TFT structure may include a gate electrode 22 formed on the first region of the substrate 20, an insulating layer 25 formed on the gate electrode 22, and an active region 26 formed on a region of the insulating layer 25 corresponding to the gate electrode 22. A source region 27a and a drain region 27b may be formed at both sides of the active region 26 respectively. A passivation layer 28 may be formed on each of the source region 27a and the drain region 27b. The micro optical switch device 300 may be formed on a second region of the substrate 20. The micro optical switch device 300 may include a first electrode 24 formed on the substrate 20, and a second electrode 30 formed above the first electrode 24 and the passivation layer 28 to be spaced apart from the first electrode 24. A capacitor electrode 23 may be formed on the substrate 20 between the active device 100 and the micro optical switch device 300.

A display apparatus driven by a micro optical switch device may include a backlight unit that emits light supplied from a light source in one direction, the micro optical switch device that adjusts the amount of light to be emitted from the display apparatus, and a display panel. A capacitor is charged with current flowing when an active device is driven, the charged capacitor having a predetermined voltage, and the micro optical switch device connected in parallel to the capacitor is driven by the predetermined voltage of the capacitor. In the driving devices illustrated in FIGS. 1A and 1B, the first electrode 16 of the micro optical switch device 300 is formed on the insulating layer 13, and the first electrode 24 of the micro optical switch device 300 is formed on the substrate 20. These driving devices are structurally simpler than a general driving device in which a first electrode of a micro optical switch device is formed on a passivation layer. Also, because the first electrodes 16 and 24 may be formed simultaneously with the formation of the gate electrodes 11 and 22 or the source and drain regions 15a and 15b and 27a and 27b of the active device 100, a number of times that a masking process is performed may be reduced, thereby simplifying the manufacture of these driving devices.

Layers of the driving devices of a display apparatus according to an exemplary embodiment will now be described.

Referring to FIGS. 1A and 1B, the substrates 10 and 20 may be formed of a non-conductive material having transmissive properties that allows light to pass there through. For example, the substrates 10 and 20 may be formed of amorphous glass.

The gate electrodes 11 and 22, the capacitor electrodes 12 and 23, the source regions 15a and 27a, the drain regions 15b and 27b, the first electrodes 16 and 24, and the second electrodes 19 and 30 may be formed of a conductive material, e.g., at least one selected from the group consisting of metal, a conductive metal oxide, a conductive metal nitride, a carbon nano structure, and a conductive polymer. The gate electrodes 11 and 22, the capacitor electrodes 12 and 23, the source regions 15a and 27a, the drain regions 15b and 27b, the first electrodes 16 and 24, and the second electrodes 19 and 30 may be formed of the above conductive material but may also be formed of a different conductive material, e.g., a carbon nano structure, such as carbon nanotube (CNT) or graphene; a conductive polymer, such as polypyrrole, polyaniline, polyacetylene, polythiophene, polyphenylene vinylene, polyphenylene sulfide, poly p-phenylene, or polyheterocycle vinylene; a metal oxide, such as indium tin oxide (ITO), aluminum zinc oxide (AZO), indium zinc oxide (IZO), tin oxide ($SnO_2$), or $In_2O_3$; or a metal nano particle dispersion thin film, such as Al, Cu, Au, or Ag.

Additionally, the first electrodes 16 and 24 and the second electrodes 19 and 30 may be formed of a conductive material having high reflectivity and high light blocking properties that reflects light passing through the substrates 10 and 20. Furthermore, a colored material, e.g., a black material, which blocks light, may be added to the first electrodes 16 and 24 and the second electrodes 19 and 30 in order to increase the light blocking properties thereof. Also, surfaces of the first electrodes 16 and 24 and the second electrodes 19 and 30 may be coated with a reflective material to increase the reflectiveness. Also, the first electrodes 16 and 24 and the second electrodes 19 and 30 may each include a plurality of openings such that these openings do not overlap with one another and do not face one another. The second electrodes 19 and 30 are disposed apart from the first electrodes 16 and 24, respectively. When the micro optical switch device 300 is driven by applying a voltage to the second electrodes 19 and 30, the distances between the second electrodes 19 and 30 and the first electrodes 16 and 24 change, thereby adjusting the amount of light being emitted from the display apparatuses. To apply the voltage to the second electrodes 19 and 30, the second electrodes 19 and 30 may be electrically connected to the capacitor electrodes 12 and 23, respectively.

The active regions 14 and 26 may be formed of any of various semiconductor materials, e.g., a Zn-based oxide semiconductor or a nitric semiconductor material. The insulating layers 13 and 25 and the passivation layers 17 and 28 may be formed of an insulating material, e.g., at least one selected from the group consisting of $ZrO_2$, $TiO_2$, $MgO$, $CeO_2$, $Al_2O_3$, $HfO_2$, $NbO$, $SiO_2$, and $Si_3N_4$.

Although the active devices 100 illustrated in FIGS. 1A and 1B are bottom gate type devices, one or more exemplary embodiments may be applied to top gate type devices. In this case, a first electrode of a micro optical switch device may also be formed simultaneously with the formation of a gate electrode or source and drain regions of an active device.

A method of manufacturing a driving device of a display apparatus according to an exemplary embodiment will now be described with reference to the accompanying drawings.

FIGS. 3A to 3G are cross-sectional views illustrating a method of manufacturing the driving device of FIG. 1A, according to an exemplary embodiment.

Figure 3A:
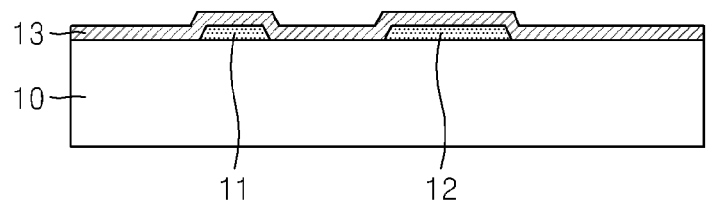
FIGS. 3A to 3G are cross-sectional views illustrating a method of manufacturing a driving device of a display apparatus according to an exemplary embodiment.

Referring to FIG. 3A, a conductive material layer is formed on the substrate 10 by using a material containing at least one selected from the group consisting of metal, a conductive metal oxide, a conductive metal nitride, a carbon nano structure, and a conductive polymer, and is patterned to form the gate electrode 11 and the capacitor electrode 12. Then, the insulating layer 13 is formed on the substrate 10, the gate 11, and the capacitor electrode 12 by using an insulating material.

Figure 3B:
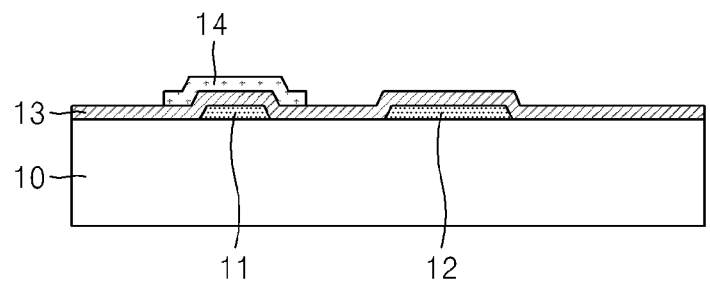

Referring to FIG. 3B, the active region 14 is formed on a region of the insulating layer 13 corresponding to the gate electrode 11 by using a semiconductor material.

Figure 3C:
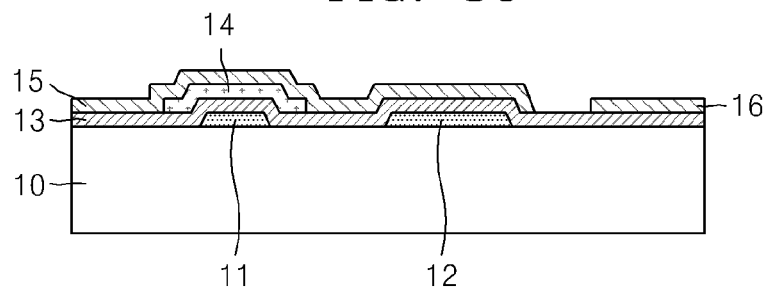

Referring to FIG. 3C, a conductive material layer is formed on the insulating layer 13 and the active region 14 by using a material containing at least one selected from the group consisting of metal, a conductive metal oxide, a conductive metal nitride, a carbon nano structure, and a conductive polymer, and the conductive material layer is patterned to form a source and drain material layer 15 of the active device 100 and the first electrode 16 of the micro optical switch device 300.

Figure 3D:
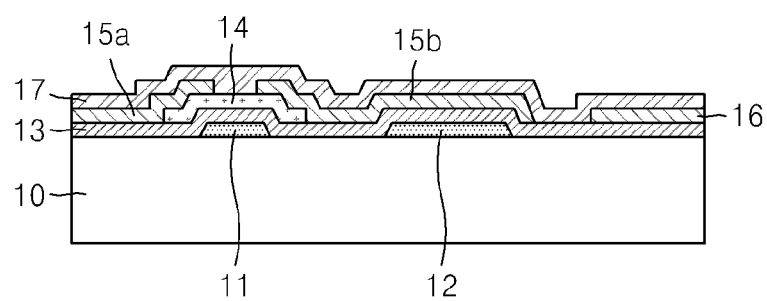

Referring to FIG. 3D, the source region 15a and the drain region 15b are formed by forming openings in the source and drain material layer 15 to expose the active region 14 below the source and drain material layer 15. Then, the passivation layer 17 is formed on the source region 15a, the drain region 15b, and the first electrode 16 by using an insulating material.

Figure 3E:
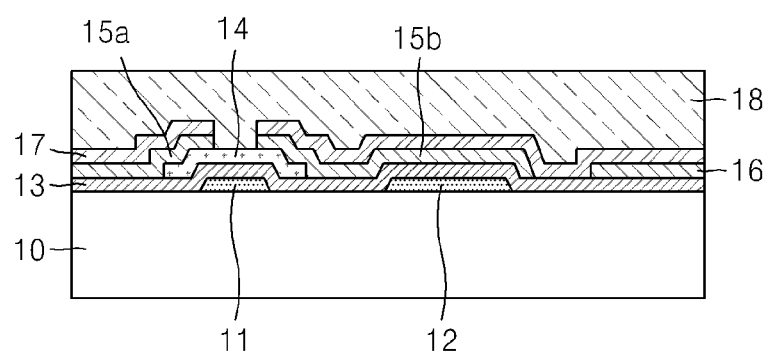

Referring to FIG. 3E, an opening is formed in the passivation layer 17 to expose the active region 14, and a sacrificial layer 18 is formed on the passivation layer 17 and the exposed active region 14. For example, the sacrificial layer 18 may be formed of a photosensitive material that chemically reacts with light, such as a solid powder and a volatile solvent, or may be formed of a polymeric material.

Figure 3F:
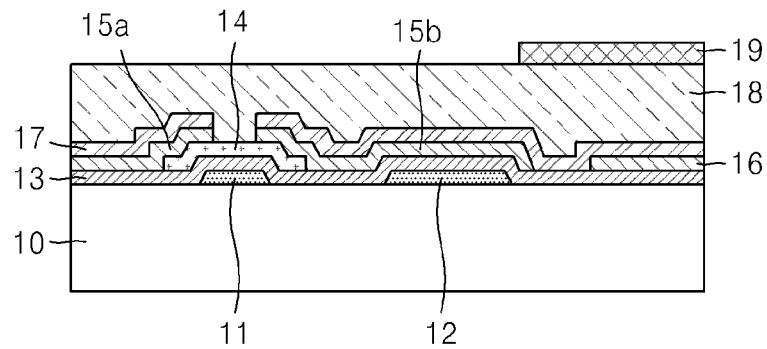
Figure 3G:
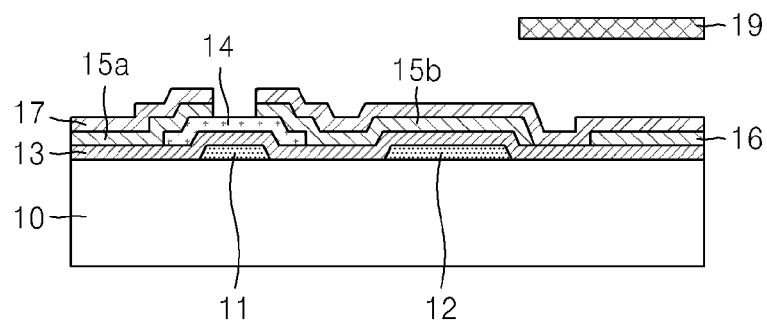

Referring to FIG. 3F, the second electrode 19 is formed on a region of the sacrificial layer 18 corresponding to the first electrode 16 by using a conductive material. Then, referring to FIG. 3G, the sacrificial layer 18 is removed to complete the driving device of FIG. 1. The sacrificial layer 18 may be easily removed using an ashing process.

As described above, when the first electrode 16 of the micro optical switch device is formed simultaneously with the formation of the source region 15a and the drain region 15b of the active device 100, the display device may be formed in a simpler manner than when the first electrode 16 is separately formed on the active device 100.

FIGS. 4A to 4H are cross-sectional views illustrating a method of manufacturing the driving device of FIG. 1B, according to another exemplary embodiment.

Figure 4A:
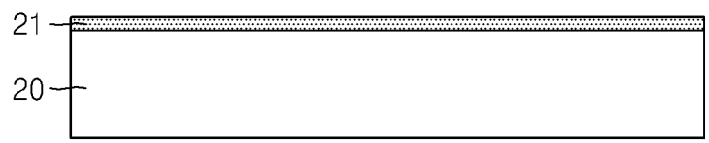
FIGS. 4A to 4H are cross-sectional views illustrating a method of manufacturing a driving device of a display apparatus according to another exemplary embodiment.

Referring to FIG. 4A, a conductive material layer 21 is formed on the substrate 20 by using a material containing at least one selected from the group consisting of metal, a conductive metal oxide, a conductive metal nitride, a carbon nano structure, and a conductive polymer.

Figure 4B:
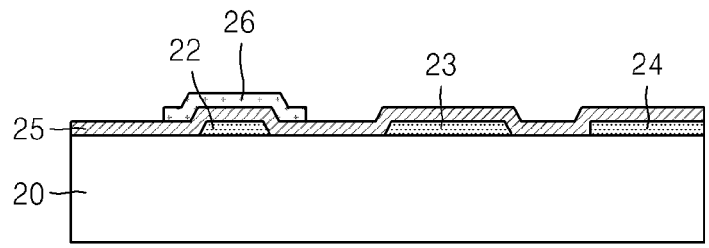

Referring to FIG. 4B, the conductive material layer 21 is patterned to form the gate electrode 22, the capacitor electrode 23, and the first electrode 24. The gate electrode 22 may be formed on a first region of the substrate 20, the first electrode 24 may be formed on a second region of the substrate 20, and the capacitor electrode 23 may be formed between the gate electrode 22 and the first electrode 24 to be spaced apart from the gate electrode 22 and the first electrode 24. Then, the insulating layer 25 may be formed on the substrate 20, the gate electrode 22, the capacitor electrode 23, and the first electrode 24 by using an insulating material. Then, the active region 26 is formed on a region of the insulating layer 25 corresponding to the gate electrode 22 by using a semiconductor material.

Figure 4C:
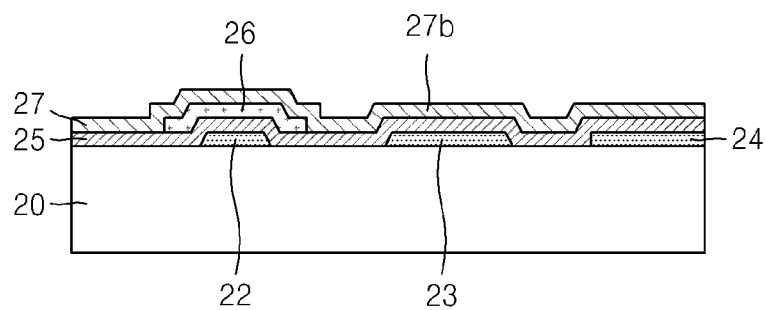

Referring to FIG. 4C, a conductive material layer region 27 is formed on the insulating layer 15 and the active region 26 by using a material containing at least one selected from the group consisting of metal, a conductive metal oxide, a conductive metal nitride, a carbon nano structure, and a conductive polymer.

Figure 4D:
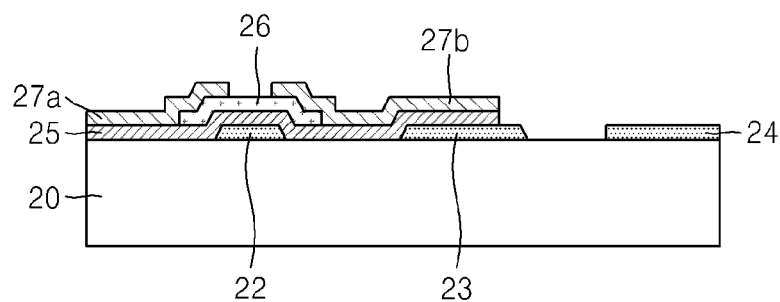

Referring to FIG. 4D, the conductive material layer region 27 is patterned to form the source region 27a and the drain region 27b of the active device 100, and expose the active region 26. In this case, the conductive material layer region 27 on the first electrode 24 and the insulating layer 25 on the first electrode 24 may be removed together with the patterning of the conductive material layer region 27.

Figure 4E:
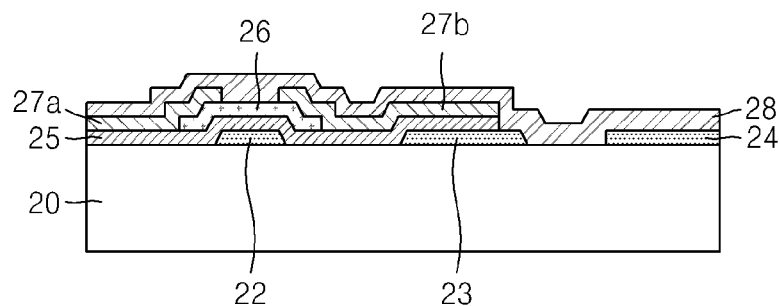
Figure 4F:
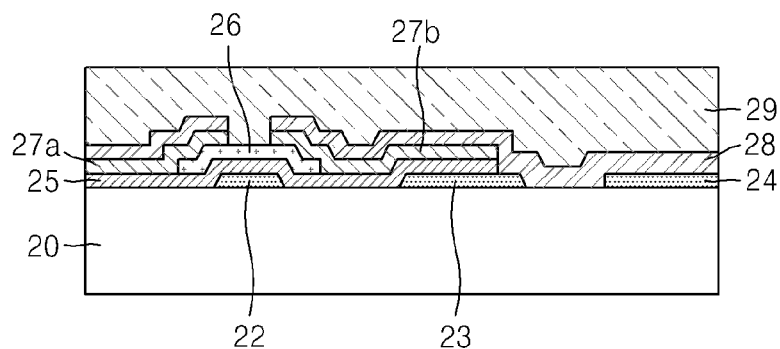

Referring to FIG. 4E, a passivation layer 28 is formed by depositing an insulating material on the resultant structure. Then, as illustrated in FIG. 4F, a region of the passivation layer 28 is patterned to expose the active region 26, and the sacrificial layer 29 is formed on the passivation layer 28 and the exposed active region 26. The sacrificial layer 29 may be formed of, for example, a photosensitive material that chemically reacts with light, such as a solid powder and a volatile solvent, or may be formed of a polymeric material.

Figure 4G:
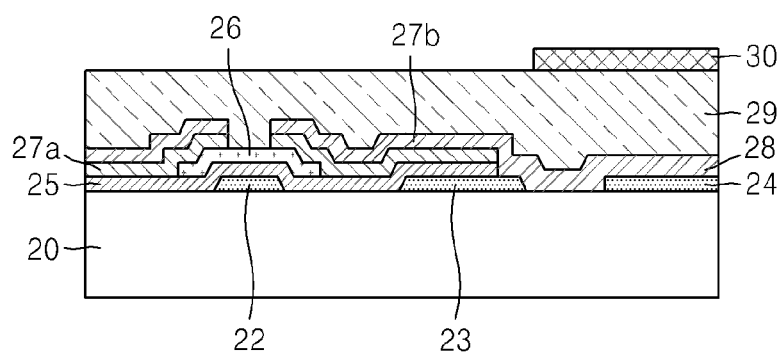

Referring to FIG. 4G, the second electrode 30 is formed on a region of the sacrificial layer 29 corresponding to the first electrode by using a conductive material.

Figure 4H:
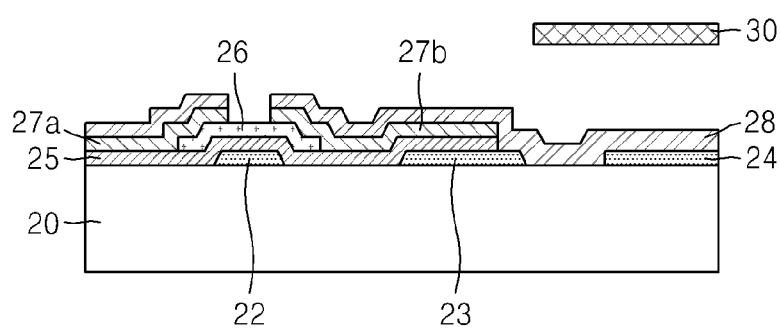

Then, referring to FIG. 4H, the sacrificial layer 29 is removed using the ashing process to complete the driving device of FIG. 2.

As described above, when the first electrode 24 of the micro optical switch device 300 is formed simultaneously with the formation of the gate electrode 22 of the active device 100, the display device may be formed in a simpler manner than when the first electrode 24 of the micro optical switch device 300 is separately formed on the active device 100.

As described above, according to the one or more exemplary embodiments, because a first electrode of a micro optical switch device is formed simultaneously with the formation of a gate electrode or source and drain regions of an active device, a driving device of a display apparatus may have a simple structure and a number of times that a masking process is performed is reduced, thereby simplifying the manufacture of a driving device of a display apparatus.

It should be understood that the exemplary embodiments described herein should be considered in a descriptive sense only and not for purposes of limitation. Descriptions of features or aspects within each embodiment should typically be considered as available for other similar features or aspects in other embodiments. In the present disclosure, a bottom gate type active device has been described but one or more may also be applied to a top gate type active device.

What is claimed is:

1. A driving device of a display apparatus, the driving device comprising: an active device formed in a first region of a substrate; a micro optical switch device formed in a second region of the substrate wherein the active device is not formed; and a capacitor formed on the substrate between the active device and the micro optical switch device, wherein the active device comprises: a gate electrode formed in the first region of the substrate; an insulating layer formed on the gate electrode; an active region formed on the insulating layer above the gate electrode; and a source region and a drain region respectively formed at either side of the active region, wherein the micro optical switch device comprises: a first electrode formed on the insulating layer in the second region of the substrate; and a second electrode formed above and spaced apart from the first electrode, and wherein a passivation layer is formed on the source region, the drain region, and directly on the first electrode.

2. The driving device of claim 1, wherein the capacitor comprises a capacitor electrode formed between the active device and the micro optical switch device.

3. The driving device of claim 1, wherein the source region, the drain region, and the first electrode are formed of the same material.

4. A driving device of a display apparatus, the driving device comprising: an active device formed in a first region of a substrate; a micro optical switch device formed in a second region of the substrate wherein the active device is not formed; and a capacitor formed on the substrate between the active device and the micro optical switch device, wherein the active device comprises: a gate electrode formed in the first region of the substrate; an insulating layer formed on the gate electrode; an active region formed on the insulating layer above the gate electrode; and a source region and a drain region respectively formed at either side of the active region, wherein the micro optical switch device comprises: a first electrode formed in the second region on the substrate; and a second electrode formed above and spaced apart from the first electrode, and wherein a passivation layer is formed on the source region, the drain region, and directly on the first electrode.

5. The driving device of claim 4, wherein the capacitor comprises a capacitor electrode formed between the active device and the micro optical switch device.

6. The driving device of claim 4, wherein the gate electrode, the capacitor electrode, and the first electrode are formed of the same material.

7. A method of manufacturing a driving device of a display apparatus, the method comprising: forming a gate electrode of an active device and a capacitor electrode on a substrate; forming an active region on an insulating layer above the gate electrode; forming a source region and a drain region of the active device, and a first electrode of a micro optical switch device, by forming a conductive material layer on the insulating layer and the active region, and patterning the conductive material layer; and forming a passivation layer on the source region, the drain region, and directly on the first electrode using an insulating material, wherein the micro optical switch device is formed in a region of the substrate wherein the active device is not formed.

8. The method of claim 7, wherein the forming the gate electrode further comprises:
    forming a conductive material layer on the substrate and patterning the conductive material layer; and
    forming the insulating layer.

9. A method of manufacturing a driving device of a display apparatus, the method comprising:
    forming a gate electrode of an active device, a capacitor electrode, and a first electrode of a micro optical switch device by forming a conductive material layer on a substrate and patterning the conductive material layer, and forming an insulating layer;
    forming an active region on the insulating layer above the gate electrode; and
    forming a source region and a drain region of the active device.

10. The method of claim 9, wherein forming the source region and the drain region further comprises:
    forming a conductive material layer on the insulating layer and the active region; and
    patterning the conductive material layer.

11. The method of claim 9, further comprising:
    forming a passivation layer on the source region, the drain region, and the first electrode using insulating material.

12. A method of manufacturing a driving device, the method comprising:
    disposing a first electrode on a substrate at the same time as at least one of a gate electrode and a capacitor electrode, and a source region and a drain region,
    disposing an insulating layer, an active region, a passivation layer, and a second electrode on the substrate.

13. A driving device comprising:
    a first electrode disposed on a substrate at a same time and layer depth as at least one of a gate electrode and a capacitor electrode, and a source region and a drain region; and
    an insulating layer, an active region, a passivation layer, and a second electrode disposed on the substrate.

14. The driving device of claim 13, further comprising;
    an active device, in a first region, comprising the gate electrode, part of the insulating layer, the active region, the source region, part of the drain region, and part of the passivation layer;

a micro optical switch device, in a second region, comprising the first electrode, part of the passivation layer, and a second electrode; and a capacitor, between the active device and micro optical switch device, comprising the capacitor electrode, part of the insulating layer, part of the drain region, and part of the passivation layer.

\* \* \* \* \*